(12) United States Patent
Singhvi et al.

(10) Patent No.: US 6,207,558 B1
(45) Date of Patent: *Mar. 27, 2001

(54) BARRIER APPLICATIONS FOR ALUMINUM PLANARIZATION

(75) Inventors: Shri Singhvi, Milpitas; Suraj Rengarajan, Sunnyvale; Peijun Ding, San Jose; Gongda Yao, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,082

(22) Filed: Oct. 21, 1999

(51) Int. Cl.[7] .................................. H01L 21/4763
(52) U.S. Cl. ..................... 438/648; 438/625; 438/627; 438/642; 438/643; 438/644; 438/652; 438/653; 438/654; 438/656; 438/680; 438/685; 438/687; 438/688
(58) Field of Search ..................... 438/625, 627, 438/628, 642, 643, 644, 648, 652, 653, 654, 656, 680, 685, 687, 688

(56) References Cited

U.S. PATENT DOCUMENTS

| | | | |
|---|---|---|---|
| 4,784,973 | 11/1988 | Stevens et al. | 437/200 |
| 4,920,072 | 4/1990 | Keller et al. | 437/192 |
| 4,920,073 | 4/1990 | Wei et al. | 437/200 |
| 4,926,237 | 5/1990 | Sun et al. | 357/71 |
| 4,938,996 | 7/1990 | Ziv et al. | 427/53.1 |
| 4,951,601 | 8/1990 | Maydan et al. | 118/719 |
| 4,960,732 | 10/1990 | Dixit et al. | 437/192 |
| 4,985,750 | 1/1991 | Hoshino | 357/71 |
| 4,994,410 | 2/1991 | Sun et al. | 437/192 |
| 5,010,032 | 4/1991 | Tang et al. | 437/57 |

(List continued on next page.)

FOREIGN PATENT DOCUMENTS

| | | |
|---|---|---|
| 374591 A1 | 7/1988 | (DE) . |
| 63-9925 | 6/1986 | (JP) . |
| 63-176031 | 7/1988 | (JP) . |
| 8-10693 | 3/1989 | (JP) . |
| 2-26051 | 1/1990 | (JP) . |
| 25-13900 | 1/1992 | (JP) . |

OTHER PUBLICATIONS

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," IEDM 96–365, pp. 14.5.1–14.5.4, No Date.

Shyam P. Muraka and Steven W. Hymes, "Copper Metallization for ULSI and Beyond," Critical Reviews in Solid State and Materials Sciences, 20(2):87–124 (1995) pp. 87–93 & 119–120.

(List continued on next page.)

Primary Examiner—John F. Niebling
Assistant Examiner—David A. Zarneke
(74) Attorney, Agent, or Firm—Thomason, Moser & Patterson LLP (57) ABSTRACT

The present invention provides an effective barrier layer for improved via fill in high aspect ratio sub-micron apertures at low temperature, particularly at the contact level on a substrate. In one aspect of the invention, a feature is filled by first depositing a barrier layer onto a substrate having high aspect ratio contacts or vias formed thereon. The barrier layer is preferably comprised of Ta, $TaN_x$, W, $WN_x$, or combinations thereof. A CVD conformal metal layer is then deposited over the barrier layer at low temperatures to provide a conformal wetting layer for a PVD metal. Next, a PVD metal layer is deposited onto the previously formed CVD conformal metal layer at a temperature below that of the melting point temperature of the metal to allow flow of the CVD conformal layer and the PVD metal layer into the vias.

34 Claims, 5 Drawing Sheets

U.S. PATENT DOCUMENTS

| | | | |
|---|---|---|---|
| 5,023,201 | 6/1991 | Stanasolovich et al. | 437/192 |
| 5,028,565 | 7/1991 | Chang et al. | 437/192 |
| 5,032,233 | 7/1991 | Yu et al. | 204/192.28 |
| 5,043,299 | 8/1991 | Chang et al. | 437/192 |
| 5,043,300 | 8/1991 | Nulman | 437/200 |
| 5,080,933 | 1/1992 | Grupen-Shemansky et al. | 427/255.1 |
| 5,081,064 | 1/1992 | Inoue et al. | 437/190 |
| 5,102,826 | 4/1992 | Ohshima et al. | 437/200 |
| 5,102,827 | 4/1992 | Chen et al. | 437/200 |
| 5,106,781 | 4/1992 | Penning De Vries | 437/192 |
| 5,143,867 | 9/1992 | d'Heurle et al. | 437/188 |
| 5,147,819 | 9/1992 | Yu et al. | 437/173 |
| 5,240,739 | 8/1993 | Doan et al. | 427/126 |
| 5,250,465 | 10/1993 | Iizuka et al. | 437/173 |
| 5,250,467 | 10/1993 | Somekh et al. | 437/192 |
| 5,292,558 | 3/1994 | Heller et al. | 427/533 |
| 5,308,796 | 5/1994 | Feldman et al. | 437/200 |
| 5,312,774 | 5/1994 | Nakamura et al. | 437/192 |
| 5,316,972 | 5/1994 | Mikoshiba et al. | 437/187 |
| 5,354,712 | 10/1994 | Ho et al. | 437/195 |
| 5,380,682 | 1/1995 | Edwards et al. | 437/225 |
| 5,384,284 | 1/1995 | Doan et al. | 437/190 |
| 5,429,991 | 7/1995 | Iwasaki et al. | 437/192 |
| 5,439,731 | 8/1995 | Li et al. | 428/209 |
| 5,478,780 | 12/1995 | Koerner et al. | 437/190 |
| 5,480,836 | 1/1996 | Harada et al. | 437/192 |
| 5,514,425 | 5/1996 | Ito et al. | 427/534 |
| 5,585,308 | 12/1996 | Sardella | 437/190 |
| 5,585,673 | 12/1996 | Joshi et al. | 257/751 |
| 5,607,776 | 3/1997 | Mueller et al. | 428/472 |

OTHER PUBLICATIONS

Yosi Shacham–Diamand, Valery Dubin, Matthew Angyal, "Electroless copper deposition for ULSI," Thin Solid Films 262 (1995), pp. 93–103.

C.–K. Hu, K.L. Lee, D. Gupta, and P. Blauner, "Electromigration and Diffusion in Pure Cu and Cu(Sn) Alloys," Mat. Res. Soc. Symp. Proc. vol. 427 © 1996 Materials Research Society, pp. 95–107.

K. Tsukamoto, T. Okamoto, M. Shimizu, T. Matsuykawa, and H. Harada, "Self–Aligned Titanium Silicidation by Lamp Annealing," LSI R&D Lab., Mitsubishi Electric Corp., 1984, pp. 47–50.

K. Sugai, H. Okabayaski, T. Shinzawa, S. Kishida, A. Kobayashi, T. Yako and H. Kadokura, "Aluminum chemical vapor deposition with new gas phase pretreatment using tetrakisdimethylamino–titanium for ultralarge–scale integrated–circuit metallization," Sumitomo Chemical Company Limited, Jun. 16, 1995, pp. 2115–2118.

Tohru Hara, Kouichi Tani, and Ken Inoue, Shigeaki Nakamura and Takeshi Murai, "Formation of titanium nitride layers by the nitridation of titanium in high–pressure ammonium ambient," © 1990 American Institute of Physics, pp. 1660–1662.

BARRIER APPLICATIONS FOR ALUMINUM PLANARIZATION

BACKGROUND OF THE INVENTION

1. Field of the Invention

The present invention relates to a metallization process for manufacturing semiconductor devices. More particularly, the invention relates to a method for depositing a contact barrier layer.

2. Background of the Related Art

Sub-half micron multilevel metallization represents one of the key technologies for the next generation of very large scale integration (VLSI) for integrated circuits (IC). Reliable formation of multilevel interconnect features, including contacts, vias, lines, and trenches is important to the success of VLSI and to the continued effort to increase circuit density on individual substrates and dies. As circuit densities increase, the widths of features decrease to 0.50 $\mu$m or less, whereas the thickness of the dielectric layers remains substantially constant, resulting in increased aspect ratios of the features, i.e., the height divided by width. Many traditional deposition processes such as chemical vapor deposition (CVD) and physical vapor deposition (PVD), are being challenged in applications where the aspect ratio of features formed on a substrate exceeds 2:1, and particularly where the aspect ratio approaches 4:1.

One difficulty in depositing a uniform metal-containing layer into high aspect ratio features arises when the metal-containing layer deposits on the sidewalls of the features and across the width of the feature to eventually converge across the width of the feature before the feature is completely filled. When the partially filled feature is covered, voids and discontinuities will form within the material deposited in the feature. These voids and discontinuities may result in unreliable electrical contacts, interconnects, and other circuit features.

One method used to reduce the likelihood that voids will form in features is to planarize the metal by annealing at high temperatures (e.g., >350° C.). Formation of a continuous wetting layer on the substrate is a key for successful planarization at high temperatures. However, planarization at high temperatures can result in diffusion of metals through barrier/liner layers and into surrounding dielectric materials. As a result, high temperature processes have not been used at the contact level of a substrate.

It has been discovered that a thin conformal metal film is a good wetting layer for subsequent physical vapor deposition and planarization techniques performed at low temperatures ( e.g., <550° C.). This process is more thoroughly disclosed in U.S. Pat. No. 5,877,087, Mosely et al., entitled "Low Temperature Integrated Metallization Process and Apparatus" which was issued on Mar. 2, 1999, and is commonly assigned to Applied Materials, Inc.

Mosely et al. teaches first depositing a thin refractory metal layer, then depositing a CVD metal layer at a low temperature to provide a conformal wetting layer for a subsequently deposited PVD metal. The PVD metal is deposited onto the previously formed CVD metal layer at a temperature below that of the melting point temperature of the metal. The resulting CVD/PVD metal layer is substantially void-free in the feature. The refractory metal layer provides a barrier to diffusion by the CVD or PVD metal layers into the underlying layers which are often dielectric layers which are susceptible to metal diffusion. The refractory metal layer typically includes such materials as titanium (Ti), titanium nitride, or a combination of these materials. The CVD and PVD layers have conventionally been aluminum (Al) and aluminum doped with copper. However, deposition of aluminum over an underlying titanium (Ti) refractory metal layer presents the problem of titanium tri-aluminide ($TiAl_3$) formation. Ti has a propensity to bind Al and form $TiAl_3$ which is an insulator, thereby compromising the performance of a conductive feature.

One solution to prevent $TiAl_3$ formation is to follow deposition of a Ti layer with deposition of a titanium nitride (TiN) layer. The overlying TiN layer reduces the amount of Ti available to bind Al, thereby minimizing the formation of $TiAl_3$. Additionally, the TiN layer is a good intermediate "glue" layer providing good bonding with both titanium and aluminum, yet titanium nitride does not interact with the aluminum. Although a deposition sequence of Ti/TiN/Al has been shown to reduce the formation of $TiAl_3$, the sequence requires that the TiN layer substantially cover the Ti layer in order to prevent any interaction with Al. Unfortunately, the inclusion of an additional layer in the metallization stack further decreases the feature size. In an attempt to minimize the thickness of the metallization stack, a very thin layer of TiN layer has been deposited on the Ti layer. However, such a thin TiN layer may be less than continuous and thereby less effective at preventing the formation of $TiAl_3$.

One alternative solution to avoid increased barrier layer thickness by the combination of a Ti/TiN barrier layer is to use TiN as barrier layer in the absence of an underlying Ti layer. However, a TiN barrier layer is conventionally deposited by physical vapor deposition techniques which may result in less than conformal barrier layer in the small, high aspect ratio features and thus, may be ineffective at preventing diffusion between the layers of the deposited metallization stack.

One notable problem occurs in multi-layer metallization processes where titanium and/or titanium nitride are used as a barrier layer for conducting metals such as aluminum and copper. In high temperature (e.g., >350° C.) processes, such as the planarization techniques described in Mosely et al., aluminum may diffuse through the Ti, combination Ti/TiN, or TiN barrier layers. If the metal is deposited at the contact level, conducting metals can diffuse through the barrier layers and react with the underlying silicon and surrounding oxides. The diffusion of Aluminum, and now copper, which is being used because of copper's lower resistivity, higher electromigration resistance, and higher current carrying capacity compared to aluminum, into the underlying silicon and surrounding oxides can alter the electronic device characteristics of the adjacent layers and form a conductive path between the layers, thereby reducing the reliability of the overall circuit and may form short circuits which can result in device failure.

Therefore, there remains a need for a reliable barrier layer scheme for metallization processes, particularly in processes for filling and planarizing high aspect ratio sub-half micron contacts and vias with conducting metals such as aluminum and copper.

SUMMARY OF THE INVENTION

An embodiment of the invention provides a process for forming a conductive feature on a substrate. In one aspect, a thin barrier layer is formed on a substrate followed by a thin conformal metal layer deposited by chemical vapor deposition (CVD) formed over the barrier layer. The barrier layer has a thickness less than about 2000 Å, and preferably between about 5 Å and 1000 Å. The conformal metal layer has a thickness between about 200 Å and 1 micron, preferably a thickness less than the thickness which would seal the top of the feature. A metal layer is then deposited by physical vapor deposition over the conformal metal layer at a temperature below about 660° C. to substantially fill the aperture. The PVD metal layer and the CVD conformal metal layer may then be annealed at a temperature between about 250° C. and about 450° C. The CVD conformal metal layer and the PVD metal layer are typically a metal conductor, preferably aluminum (Al), copper (Cu), and combinations thereof. The barrier/wetting layer is made of a material selected from the group of tantalum (Ta), tantalum nitride ($TaN_x$), tungsten (W), or tungsten nitride ($WN_x$) and combinations thereof. The process is preferably carried out sequentially in an integrated processing system.

In another aspect of the invention, a substrate is produced from the metallization process that is carried out in an integrated processing system that includes both a PVD and CVD processing chamber. The substrate comprises a semiconductor substrate, a dielectric layer formed on the semiconductor substrate, the dielectric layer having an aperture formed therein and communicating with the semiconductor substrate, a barrier/wetting layer formed over the surfaces of the aperture, wherein the barrier/wetting layer comprises a material selected from the group of Ta, $TaN_x$, W, $WN_x$, and combinations thereof. The barrier layer preferably has a thickness less than about 2000 Å, preferably between about 5 Å and 1000 Å. Next, a chemical vapor deposited conformal metal layer such as Al, Cu, and combinations thereof is formed over the barrier/wetting layer. Finally, a metal layer is deposited by physical vapor deposition or electroplating over the chemical vapor deposited conformal metal layer. The physical vapor deposited metal layer is deposited at a temperature below about 400° C. to cause the CVD and PVD deposited metal layers to flow into the aperture and form an interconnect without forming voids therein. The PVD metal layer preferably comprises a material selected from the group of Al, Cu, and combinations thereof.

Another aspect of the invention provides for a program product, which when read and executed by a computer, comprises the steps of generating a plasma in a chamber, providing a bias to a target disposed in the chamber, providing a bias to a coil, and maintaining the chamber pressure between about 0.5 mTorr and about 100 mTorr during the deposition of a material onto a substrate. The program product provides a RF bias to the coil between about 200 W and about 24 kW, and provides a bias to the target between about 200 W and about 24 kW. The program product may further comprise providing a bias to the substrate of between about 0 W and 1000 W. The target disposed in the chamber is preferably a material selected from the group of Ta, TaN, W, WN, and combinations thereof.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides an effective barrier layer for improved via fill in high aspect ratio, sub-micron apertures which can be deposited at low process temperatures. The invention also provides methods for metallizing high aspect ratio apertures, including contacts, vias, lines or other features, at temperatures below about 660° C. In particular, the invention provides improved step coverage for filling high aspect ratio apertures in applications with a first layer of conducting metal, preferably CVD aluminum (CVD Al) or CVD copper (CVD Cu), and a second layer of a conducting metal, preferably PVD aluminum (PVD Al) or PVD copper (PVD Cu). The thin CVD layer is prevented from dewetting from a dielectric layer or diffusing into the dielectric layer by deposition of a thin barrier/wetting layer comprised of a conducting metal having a melting point greater than that of the CVD and/or PVD metal layer and providing greater wetting with the CVD metal layer than does the dielectric. A barrier layer, such as tantalum (Ta), tantalum nitride ($TaN_x$), tungsten (W), tungsten nitride ($WN_x$), or combinations thereof are preferred to prevent the diffusion of aluminum or copper into adjacent dielectric materials.

Figure 1:
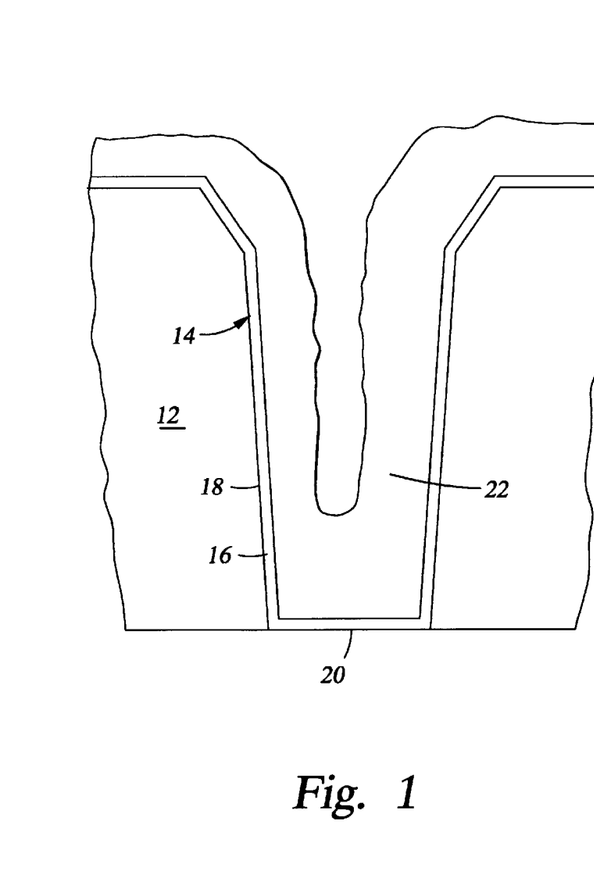
FIG. 1 is a schematic diagram of a semiconductor substrate contact according to the present invention having a barrier/wetting layer and a CVD Al layer.

FIG. 1 is a schematic view of a substrate 10 having a patterned dielectric layer 12 formed thereon and having a via 14 formed therein. A thin barrier/wetting layer 16, of a material such as tantalum or tantalum nitride, is deposited conformally onto the substrate covering substantially all surfaces of the dielectric layer 12 including the walls 18 and bottom level 20 of the via 14. The thin tantalum layer 16 generally has a thickness of less than about 2000 Å, with the preferred thickness being between about 5 Å and about 1000 Å, and most preferably being between about 100 Å and about 400 Å. A conformal CVD Al layer 22 is deposited on the barrier/wetting layer 16 to a thickness not to exceed the thickness which would bridge or seal the top of the contact or via and generally may be from about 200 Å to about 1 micron, but preferably less than about 2000 Å for half-micron features. The conformal CVD Al layer 22 acts as a seed layer, or a wetting layer for a subsequently deposited metal layer.

Figure 2:
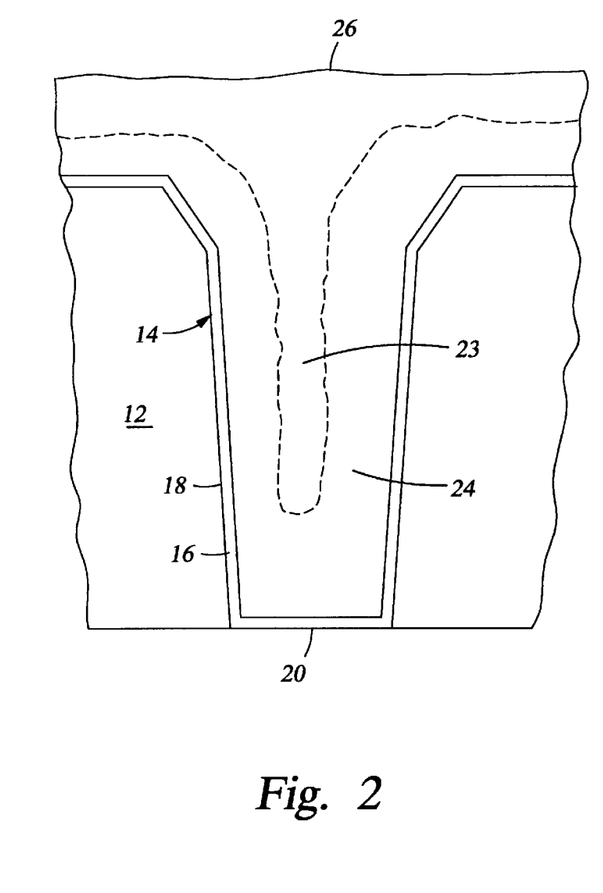
FIG. 2 is a schematic diagram of a semiconductor substrate contact according to the present invention having a barrier/wetting layer and an intermixed CVD/PVD Al layer.

FIG. 2 is a schematic view of a substrate 10 illustrating a PVD Al or Cu layer deposited onto the CVD Al or Cu layer 22 to form a PVD layer 23 thereon. An intermixed CVD/PVD layer 24 may result as the PVD layer is deposited onto and integrates into the CVD layer. The top surface 26 of the intermixed layer 24 will be substantially planarized. The PVD layer may contain certain dopants and upon deposition the PVD material may intermix with the CVD material so that the dopant is dispersed throughout the PVD/CVD intermixed layer 24. The dopant may be copper in an aluminum layer, and may be aluminum or tin (Sn) in a copper layer.

Since the barrier/wetting layer provides good wetting of the CVD layer, the substrate temperature during deposition of PVD does not need to exceed the melting point of aluminum (660° C.), but rather may be performed at a temperature below about 660° C. and is preferably performed at a temperature below about 400° C. A lower metallization process temperature develops less stress in the metal layers of the process which results in less extrusion and diffusion problems between the metal layers and barrier layers. Further, the improved barrier layer provides a greater thermal stability and higher resistance to diffusion which minimizes potential diffusion by the metal layers into the dielectric layers and underlying substrate.

Preferably, the metallization process is carried out in an integrated processing system including both CVD and PVD processing chambers. Once the substrate is introduced into a vacuum environment, the metallization of the vias and contacts occurs without the formation of an oxide layer between deposition steps. This results because the substrate need not be transferred from one processing system to another system to undergo deposition of the CVD and PVD deposited layers. Additionally, the barrier/CVD/PVD sequence provides the advantage of being resistant to oxidation and may, therefore, be exposed to air between steps without the formation of oxides which increase the electrical resistance of the features formed on the substrate.

The planarization and via fill process of the present invention advantageously incorporates aluminum (Al) and copper's (Cu) demonstrated ability to flow at temperatures below their respective melting points due to the effects of surface tension. Due to their low melting points and flow characteristics, Al and Cu do not have good coverage or adhere well to the underlying dielectric layers at high temperatures. Al and Cu may diffuse through the traditional titanium (Ti) and titanium nitride (TiN) barrier/wetting layers used to improve the wetting and coverage of the metal. Therefore, the present invention incorporates a barrier/wetting layer having a greater thermal stability and resistance to diffusion to advantageously use the flow characteristics of Al and Cu for an improved planarization and via fill.

The preferred barrier/wetting layers with good conformal coverage having high thermal stability and resistance to diffusion include tantalum (Ta), tantalum nitride ($TaN_x$), tungsten (W), tungsten nitride ($WN_x$), or combinations thereof. Tantalum (Ta), having good adhesion properties with aluminum and copper, and a melting temperature of about 2985° C., and tungsten (W) with a melting temperature of about 3400° C., are preferred barrier/wetting materials due to their higher melting points and higher thermal stability than aluminum or copper. Ta and W may be further deposited as the nitrates tantalum nitride ($TaN_x$) and tungsten nitride ($WN_x$), and the nitrated layers may have improved diffusion and wetting characteristics over Ta and W.

The barrier/wetting layers can be deposited by either chemical vapor deposition (CVD), physical vapor deposition (PVD), or high/medium density plasma PVD known as ionized metal plasma (IMP) PVD. The barrier/wetting materials are deposited to a thickness of less than about 2000 Å, preferably between about 5 Å and about 1000 Å, and most preferably between about 100 Å and about 400 Å. Deposition of the barrier/wetting layers is preferably performed by ionized metal plasma (IMP) deposition techniques, which are capable of depositing thin, conformal films on the surfaces of high aspect ratio features to form a substantially continuous film over the patterned dielectric layer. W and $WN_x$ layers can also be deposited by IMP PVD to provide conformal films in high aspect ratio features. The use of the barrier materials of the invention eliminate the need to deposit a separate wetting layer as required in Ti/TiN barrier layer schemes resulting in a one-step deposition process, thereby increasing substrate throughput.

Figure 3:
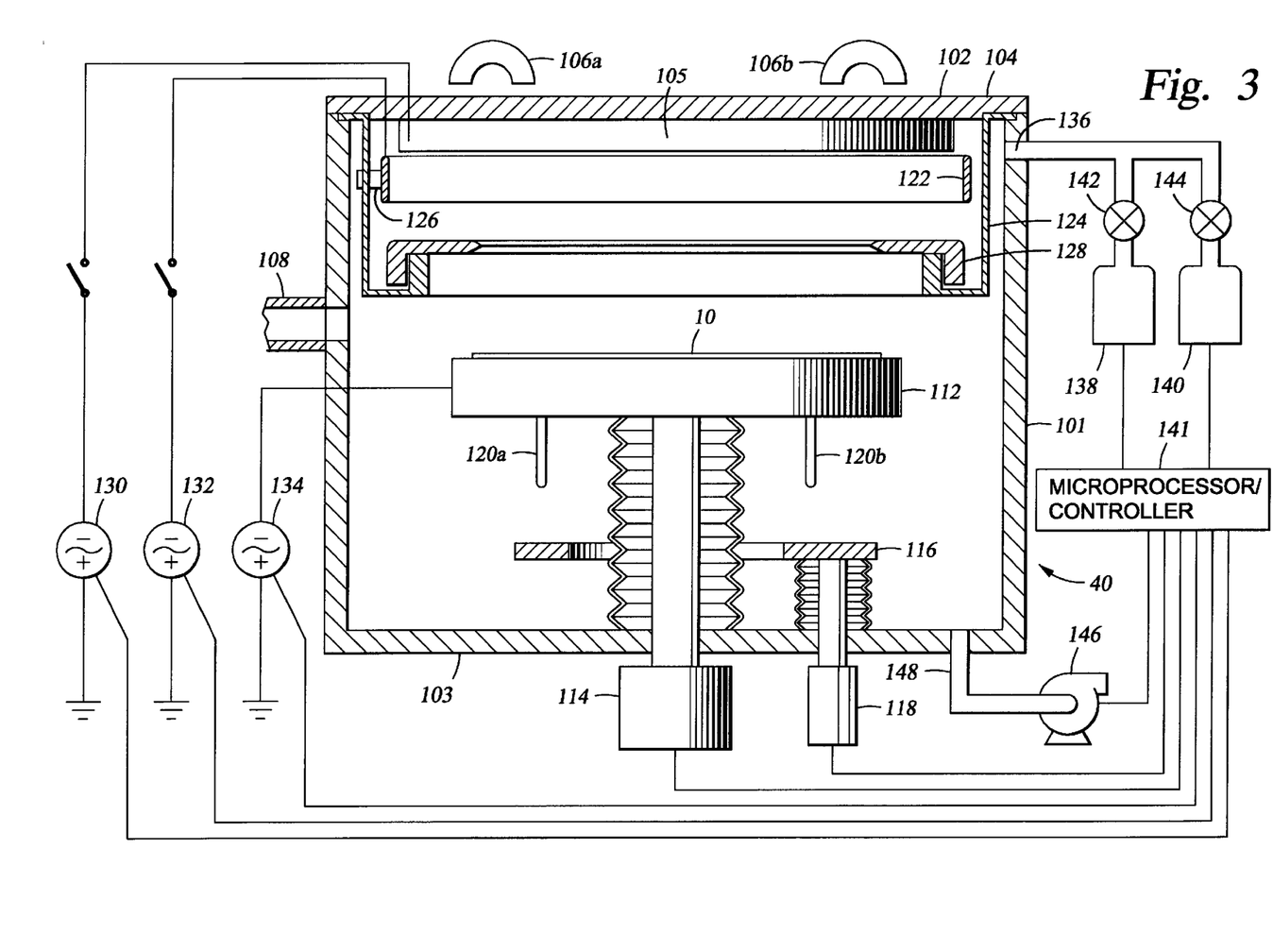
FIG. 3 is a schematic cross-sectional view of an IMP-PVD chamber suitable for performing the PVD processes of the present invention.

FIG. 3 is a schematic cross-sectional view of an IMP chamber 40. An IMP processing chamber, known as an IMP Vectra™ chamber, is available from Applied Materials, Inc. of Santa Clara, Calif. The IMP chamber can be integrated into an Endura™ platform, also available from Applied Materials, Inc. The IMP process provides a higher pressure plasma, a high density plasma (HDP), than standard PVD that causes the sputtered target material to become ionized as the sputtered material passes therethrough. The HDP-PVD ionization enables the sputtered material to be attracted in a substantially perpendicular direction to a biased substrate surface and to conformally deposit a layer even in high aspect ratio features. The chamber 40 includes sidewalls 101, lid 102, and bottom 103. The lid 102 includes a target backing plate 104 which supports a target 105 of the material to be deposited. The target 105 is preferably made of a conductive material to be deposited, preferably tantalum and tungsten for tantalum, tantalum nitride, tungsten, and tungsten nitride depositions.

An opening 108 in the chamber 40 provides access for a robot (not shown) to deliver and retrieve substrates 10 to and from the chamber 40, wherein the substrate 10 is received in the chamber 40 and positioned on a substrate support 112. The substrate support 112 supports the substrate 10 for depositing a layer of sputtered material in the chamber and is typically grounded. The substrate support 112 is mounted on a lift motor 114 that raises and lowers the substrate support 112 and a substrate 10 disposed thereon. A lift plate 116 connected to a lift motor 118 is mounted in the chamber 40 and raises and lowers pins 120a, 120b mounted in the substrate support 112. The pins 120a, 120b raise and lower the substrate 10 from and to the surface of the substrate support 112.

A coil 122 is mounted between the substrate support 112 and the target 105 and provides inductively-coupled magnetic fields in the chamber 40 to assist in generating and maintaining a plasma between the target 105 and substrate 10. The coil 122 is sputtered due to its location between the target and the substrate 10 and preferably is made of similar constituents as the target 105. For instance, the coil 122 could be made of copper and phosphorus. The doping percentage of the coil 122 could vary compared to the target doping percentage depending on the desired layer composition and is empirically determined by varying the relative doping percentages. Power supplied to the coil 122 densifies the plasma which ionizes the sputtered material. The ionized material is then directed toward the substrate 10 and deposited thereon.

A shield 124 is disposed in the chamber 40 to shield the chamber sidewalls 101 from the sputtered material. The shield 124 also supports the coil 122 by coil supports 126. The coil supports 126 electrically insulate the coil 122 from the shield 124 and the chamber 40 and can be made of similar material as the coil. The clamp ring 128 is mounted between the coil 122 and the substrate support 112 and shields an outer edge and backside of the substrate from sputtered materials when the substrate 10 is raised into a processing position to engage the lower portion of the clamp ring 128. In some chamber configurations, the shield 124 supports the clamp ring 128 when the substrate 10 is lowered below the shield 124 to enable substrate transfer.

Three power supplies are used in this type of sputtering chamber. A power supply 130 delivers preferably DC power to the target 105 to cause the processing gas to form a plasma, although RF power can be used. Magnets 106a, 106b disposed behind the target backing plate 104 increase the density of electrons adjacent to the target 105, thus increasing ionization at the target to increase the sputtering efficiency. The magnets 106a, 106b generate magnetic field lines generally parallel to the face of the target, around which electrons are trapped in spinning orbits to increase the likelihood of a collision with, and ionization of, a gas atom for sputtering. A power supply 132, preferably a RF power supply, supplies electrical power to the coil 122 to increase the density of the plasma. Another power supply 134, typically a DC power supply, biases the substrate support 112 with respect to the plasma and provides directional attraction of the ionized sputtered material toward the substrate 10.

Processing gas, such as an inert gas of argon or helium or a reactive gas such as nitrogen, is supplied to the chamber 40 through a gas inlet 136 from gas sources 138, 140 as metered by respective mass flow controllers 142, 144. A vacuum pump 146 is connected to the chamber 40 at an exhaust port 148 to exhaust the chamber 40 and maintain the desired pressure in the chamber 40.

A controller 141 generally controls the functions of the power supplies, lift motors, mass flow controllers for gas injection, vacuum pump, and other associated chamber components and functions. The controller 141 controls the power supply 130 coupled to the target 105 to cause the processing gas to form a plasma and sputter the target material. The controller 141 also controls the power supply 132 coupled to the coil 122 to increase the density of the plasma and ionize the sputtered material. The controller 141 also controls the power supply 134 to provide directional attraction of the ionized sputtered material to the substrate surface. The controller 141 executes system control software stored in a memory, which in the preferred embodiment is a hard disk drive, and can include analog and digital input/output boards, interface boards, and stepper motor controller boards (not shown). Optical and/or magnetic sensors (not shown) are generally used to move and determine the position of movable mechanical assemblies.

An exemplary process regime for the IMP deposition of tantalum, tantalum nitride, tungsten, and tungsten nitride is as follows for a 200 mm wafer in an ion metal plasma (IMP) chamber, known as an IMP Vectra™ chamber, available from Applied Materials, Inc. of Santa Clara, Calif. An inert gas, such as helium or argon, is introduced into the chamber at a rate sufficient to produce a chamber pressure of about 0.5 mTorr to about 100 mTorr, preferably about 20 mTorr to about 50 mTorr. For a 200 mm substrate, the power level supplied to the support member is preferably between about 0 W and 500 W when the power to the target and the coil are between about 1 kW and about 3 kW, and most preferably, the substrate power is about 300 W. The power density of the substrate support is preferably from about 0.5 W/cm$^2$ to about 1.6 W/cm$^2$, and most preferably 1.0 W/cm$^2$. For a 300 mm substrate, the power level supplied to the support member is preferably between about 500 W and 1000 W and most preferably about 750 W and the power density is between about 0.7 W/cm$^2$ and 1.4 W/cm$^2$ most preferably about 1.0 W/cm$^2$. The target in the IMP-PVD chamber is DC-biased at about 200 watts (W) to about 24 kilowatts (kW) and between about 20V and about 2400V, preferably the DC-biased is between about 1 kW and about 3 kW and between about 100V and about 300V. The coil is preferably RF-biased at between 200 W to about 24 kW, preferably between about 1 kW and about 3 kW.

The substrate is maintained at a temperature between about 10° C. to about 400° C., preferably below about 300° C. For deposition of a nitrated barrier film, such as tantalum nitride or tungsten nitride, the processing gas typically comprises an inert gas such as argon and a nitrating gas such as nitrogen, wherein argon serves as the primary gas source for the plasma ions that bombard the tantalum or tungsten target and nitrogen primarily reacts with the sputtered atoms (tungsten) from the target to form a tantalum or tungsten nitride film which is deposited onto the substrate.

A layer of CVD Al, Cu, or another conducting metal is then deposited on the barrier layer to form a conformal wetting layer on the via structure without bridging the top of the via. CVD Al and Cu provide a conformal wetting layer over the barrier/wetting layer for receipt of a subsequently deposited PVD Al or Cu layer thereon. Additionally, an electrochemical deposition process, such as electroplating and/or electroless deposition, may be used to deposit the conductive layer over the wetting layer.

While the CVD Al or Cu may be deposited under various conditions, a typical process involves substrate temperatures of between about 180° C. and about 265° C. and a deposition rate of between about 20 Å/sec to about 130 Å/sec. Preferably, the chemical vapor deposited conformal metal layer has a thickness of between about 200 Å and about 1 micron, but preferably of a thickness less than the thickness which would seal the top of the feature, especially in sub-micron high aspect ratios. The CVD Al or Cu deposition may be performed at chamber pressures of between about 1 Torr and about 80 Torr, with the preferred chamber pressures being about 25 Torr.

CVD Al may be deposited by any conventional CVD process, however, the preferred deposition reaction for CVD Al involves the reaction of dimethyl aluminum hydride (DMAH) with hydrogen gas (H$_2$). A CVD Cu layer may be deposited by any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper$^+_1$hfac,TMVS (hfac being an abbreviation for the hexafluoro acetylacetonate anion and TMVS being an abbreviation for trimethylvinylsilane) with argon as the carrier gas. Because this complex is a liquid under ambient conditions, it can be utilized in standard CVD bubbler precursor delivery systems currently used in semiconductor fabrication. Both TMVS and copper$^{+2}$(hfac)$_2$ are volatile byproducts of the deposition reaction that are exhausted from the chamber. The volatile liquid complex, Cu$^{+1}$hfac,TMVS, can be used to deposit Cu through either a thermal or plasma assisted process, with the thermal assisted process being preferred. The substrate temperature for the plasma enhanced process is preferably between about 100 and about 400° C., while that for the thermal process is between about 50 and about 300° C., most preferably about 170° C. Preferably, the chemical vapor deposited conformal metal layer has a thickness of between about 200 Å and about 1 micron. Most preferably, the chemical vapor deposited conformal metal layer has a thickness not to exceed the thickness which would seal the top of the contact or via, especially in sub-micron features.

Figure 4:
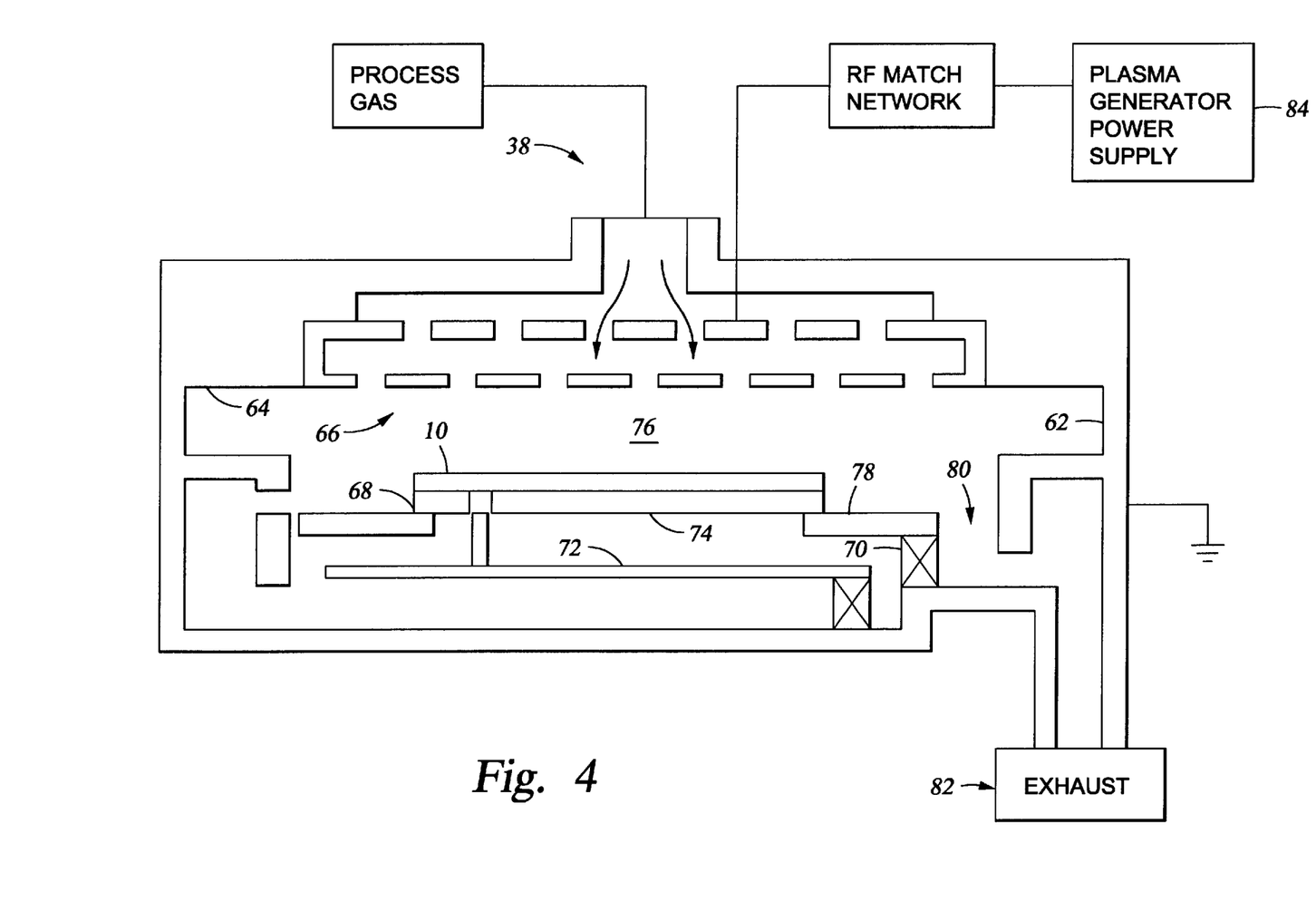
FIG. 4 is a schematic partial sectional view of a CVD chamber suitable for performing the CVD deposition processes of the present invention.

FIG. 4 is a schematic partial sectional view of the CVD deposition chamber 38 suitable for performing the CVD deposition processes of the present invention. The CVD deposition chamber 38 has surrounding sidewalls 62 and a ceiling 64. The chamber 38 comprises a process gas distributor 66 for distributing delivering process gases into the chamber. Mass flow controllers and air operated valves are used to control the flow of process gases into the deposition chamber 38. The gas distributor 66 is typically mounted above the substrate 10 or peripherally about the substrate 10. A support member 68 is provided for supporting the substrate in the deposition chamber 38. The substrate is introduced into the chamber 38 through a substrate loading inlet in the sidewall 62 of the chamber 38 and placed on the support 68. The support 68 can be lifted or lowered by support lift bellows 70 so that the gap between the substrate and gas distributor 66 can be adjusted. A lift finger assembly 72 comprising lift fingers that are inserted through holes in the support 68 can be used to lift and lower the substrate onto the support to facilitate transport of the substrate into and out of the chamber 38. A thermal heater 74 is then provided in the chamber to rapidly heat the substrate. Rapid heating and cooling of the substrate is preferred to increase processing throughput, and to allow rapid cycling between successive processes operated at different temperatures within the same chamber. The temperature of the substrate 10 is generally estimated from the temperature of the support 68.

The substrate is processed in a process zone 76 above a horizontal perforated barrier plate 78. The barrier plate 78 has exhaust holes 80 which are in fluid communication with an exhaust system 82 for exhausting spent process gases from the chamber 38. A typical exhaust system 82 comprises a rotary vane vacuum pump (not shown) capable of achieving a minimum vacuum of about 10 mTorr, and optionally a scrubber system for scrubbing byproduct gases. The pressure in the chamber 38 is sensed at the side of the substrate and is controlled by adjusting a throttle valve in the exhaust system 82.

A plasma generator 84 is provided for generating a plasma in the process zone 95 of the chamber 38 for plasma enhanced chemical vapor deposition processes. The plasma generator 84 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF can be applied to an inductor coil (not shown) to inductively couple energy into the deposition chamber to generate a plasma in the process zone 76. When an RF current is used, the frequency of the RF current is typically from about 400 KHZ to about 16 MHZ, and more typically about 13.56 MHZ. Optionally, a gas containment or plasma focus ring (not shown), typically made of aluminum oxide or quartz, can be used to contain the flow of process gas or plasma around the substrate.

Following the deposition of a CVD Al or Cu wetting layer on the substrate, the substrate is then transferred to a PVD chamber where a PVD Al or Cu layer is deposited at a temperature below the melting point temperature of the CVD and PVD metal layers. The PVD Al layer is deposited at a substrate temperature below about 660° C.; and the PVD Cu layer is deposited at a substrate temperature below about 550° C. Preferably, both PVD Al and Cu layers are deposited at a substrate temperature below about 400° C. The metal layers start to flow during the PVD deposition process at about 400° C. for aluminum and about 200° C. for copper, with the barrier/wetting layer remaining firmly in place as a solid metal layer. Because tantalum and the other barrier/wetting compositions of the invention have good wetting properties, the CVD metal is prevented from dewetting at about 400° C. Therefore, the application of a barrier/wetting layer such as tantalum, enables planarization of the metal layer to be achieved at temperatures far below the melting point of the aluminum and copper which reduces the likelihood that aluminum or copper will diffuse through the barrier layer.

One method of the present invention for metallization of a substrate aperture includes the sequential steps of precleaning the substrate surface, depositing a barrier layer such as tantalum or tantalum nitride using an IMP PVD process, i.e. high density plasma where the sputtered atoms are ionized, or a collimated PVD process, depositing a conducting metal over the barrier layer using a CVD process, depositing PVD metal in a sputtering chamber at a temperature below about 660° C. so that the PVD metal layer and CVD metal layers substantially fill the aperture. Optionally, the metallization stack produced may undergo further treatment such as the deposition of a PVD TiN anti-reflection coating ("ARC") for reducing the reflectivity of the surface of the metallization stack and improve the photolithographic performance of the metallization stack. Additionally, the stack may be further processed by chemical mechanical polishing (CMP).

Figure 5:
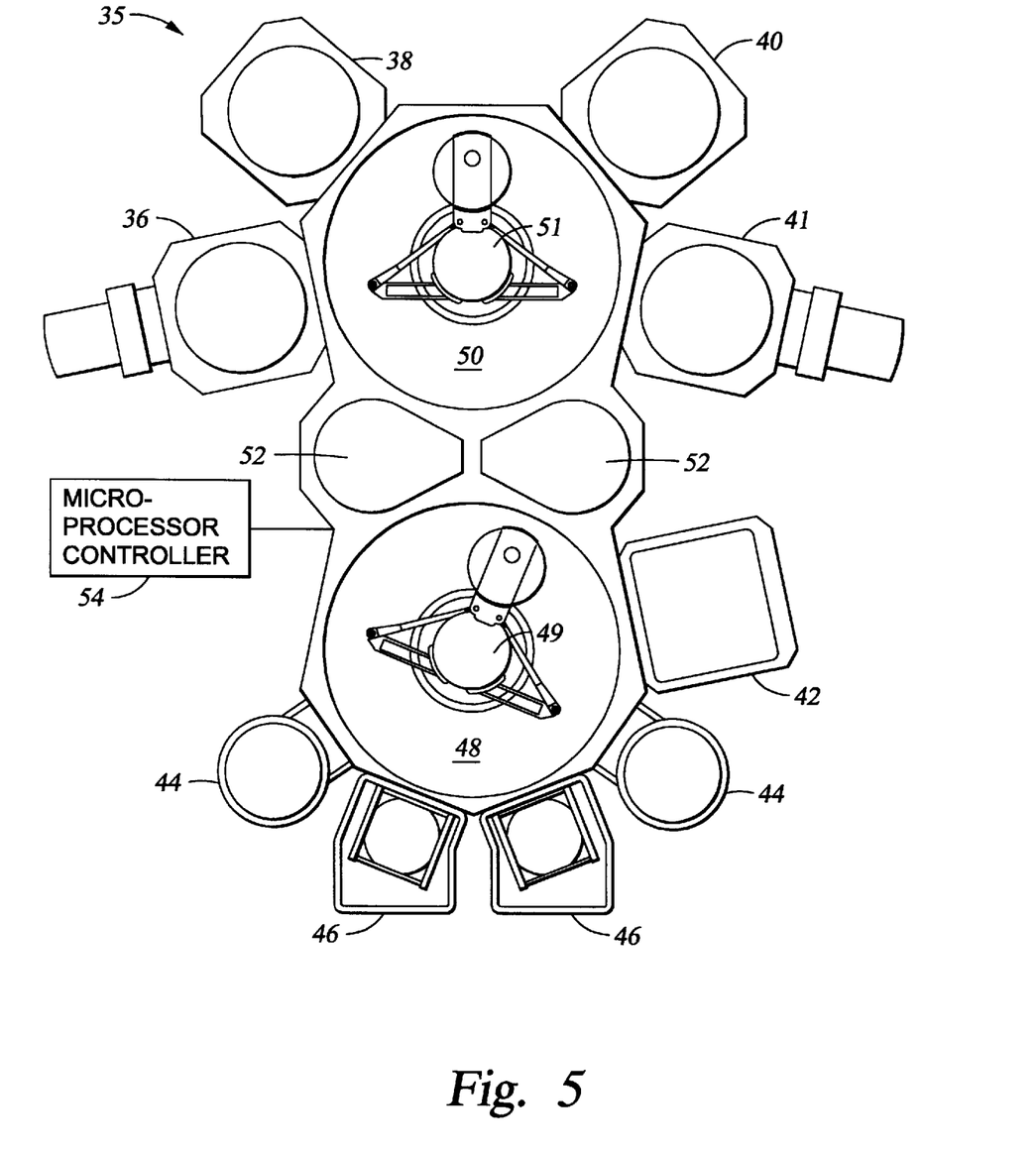
FIG. 5 is an integrated CVD/PVD system configured for sequential metallization in accordance with the present invention.

While the processes of the present invention are preferably carried out in a multi-chamber processing apparatus or cluster tool having both PVD and CVD chambers, the processes may be also be carried out in separate systems having either a PVD or a CVD chamber connected thereto. A schematic of a multi-chamber processing apparatus 35 suitable for performing the CVD and PVD processes of the present invention is illustrated in FIG. 5. The apparatus is an ENDURA® System commercially available from Applied Materials, Inc., Santa Clara, Calif. A similar staged-vacuum substrate processing system is disclosed in U.S. Pat. No. 5,186,718, entitled Staged-Vacuum Substrate Processing System and Method, Tepman et al., which issued on Feb. 16, 1993, and is incorporated herein by reference. The particular embodiment of the apparatus 35 shown herein is suitable for processing planar substrates, such as semiconductor substrates, and is provided to illustrate the invention, and should not be used to limit the scope of the invention.

The apparatus 35 includes a cluster of interconnected process chambers including at least one enclosed PVD deposition chamber 36 for performing PVD processes, such as sputtering. The PVD chamber 36 comprises a sputtering target of sputtering material facing the substrate. The target is electrically isolated from the chamber and serves as a process electrode for generating a sputtering plasma. During the sputtering process, a sputtering gas, such as argon or xenon, is introduced into the chamber 36. An DC bias is applied to the sputtering target, and the substrate support member disposed in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to about 10,000 Watts, to the sputtering target.

For the present invention, the apparatus 35 preferably includes a PVD chamber 36 for depositing conformal PVD Al or Cu layers and a CVD chamber 38 for depositing CVD Al or Cu layers. The apparatus 35 may further comprise an IMP PVD chamber 40 or another barrier/wetting layer chamber for depositing a barrier layer of the invention such as tantalum/tantalum nitride (Ta/TaN), a PVD TiN ARC chamber 41 for depositing a TiN anti-reflective coating (ARC) layer which reduces the reflectivity of the metallization stack thereby improving the photolithographic performance of the metallization stack, two pre-clean chambers 42 (such as PreClean II chambers available from Applied Materials) for removing contaminants, two degas chambers 44, and two load lock chambers 46. The apparatus 35 has two transfer chambers 48, 50 containing transfer robots 49, 51, and two cooldown chambers 52 separating the transfer chambers 48, 50. The apparatus 35 is automated by programming a microprocessor controller 54 with a computer program product 141. However, the process could also be operated by individual chambers, or a combination of the above.

Control Systems

Figure 6:
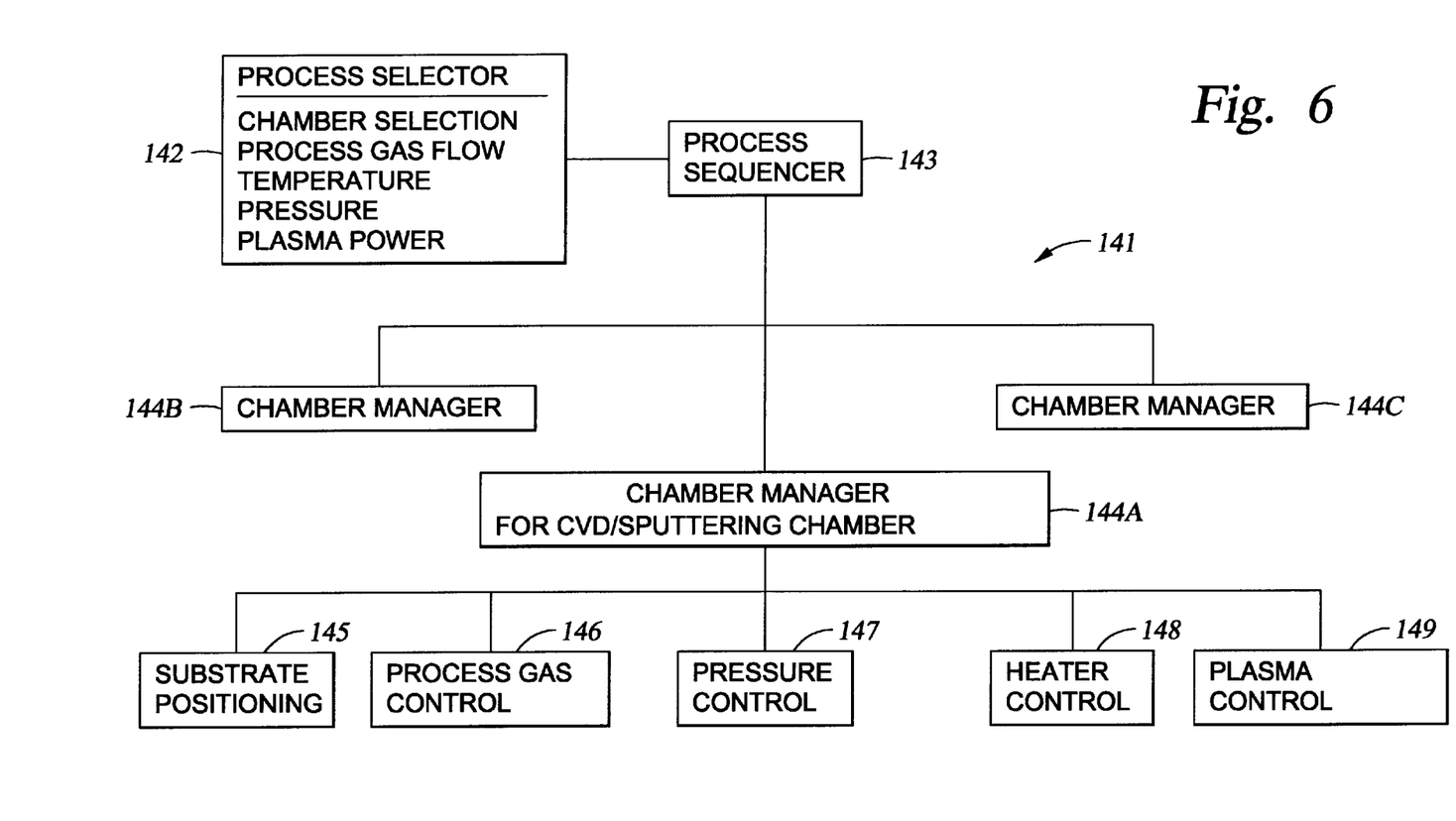
FIG. 6 is a simplified block diagram showing the hierarchical control structure of a computer program suitable for controlling a process of the present invention

Referring to FIG. 6, the processes of the present invention can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 6 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process parameters relate to process conditions such as, for example, process gas composition and flow rates, temperature, pressure, plasma conditions such as cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to the chamber manager subroutines 144A–C which control multiple processing tasks in different process chambers according to the process set determined by the sequencer subroutine 143. For example, the chamber manager subroutine 144A comprises program code for controlling CVD process operations, within the described process chamber 38. The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149.

In operation, the chamber manager subroutine 144A selectively schedules or calls the process component subroutines in accordance within the particular process set being executed. The chamber manager subroutine 144A schedules the process component subroutines similarly to how the sequencer subroutine 143 schedules which process chamber 40 and process set is to be executed next. Typically, the chamber manager subroutine 144A includes steps of monitoring the various chamber components, determining which components need to be operated based on the process parameters for the process set to be executed, and causing execution of a chamber component subroutine responsive to the monitoring and determining steps.

Hypothetical Example

The following hypothetical example describes a method of forming a feature at the contact level on a substrate. A tantalum nitride layer is used as a barrier layer for the aluminum fill of the feature.

A half-micron feature on a substrate may be filled by the present invention as follows. The substrate surface containing half-micron features were pre-cleaned to remove about 100 Å to 400 Å of material including any oxides or other contaminants. The substrate is then placed in an IMP-PVD TaN chamber having a tantalum target, wherein a plasma comprising argon and nitrogen is struck and about 400 Å of a conformal tantalum nitride layer is deposited on the substrate. The substrate is then transferred to a CVD chamber wherein a conformal aluminum layer of about 1500 Å is deposited on the barrier layer. The substrate is then transferred to a PVD Al chamber having an aluminum target for deposition of about 4000 Å of bulk aluminum at less than 350° C. The aluminum layers (conformal and bulk) are then heated in an annealing chamber. The temperature of the substrate during anneal was maintained below about 450° C.

While the foregoing is directed to embodiments of the present invention, other and further embodiments of the invention may be devised without departing from the basic scope thereof. The scope of the invention is determined by the claims that follow.

What is claimed is:

1. A method of forming a feature at the contact level on a substrate, comprising:

(a) depositing a barrier/wetting layer over the surfaces of an aperture, the barrier/wetting layer comprising a material selected from the group of Ta, $TaN_x$, W, $WN_x$, and combinations thereof;

(b) depositing a conformal metal layer over the surface of the barrier/wetting layer, the conformal metal layer having a thickness of between about 200 Angstroms and about 1 micron;

(c) depositing a metal layer over the conformal metal layer at a temperature below about 660° C.

2. The method of claim 1, wherein the barrier/wetting layer has a thickness of less than about 2000 Angstroms.

3. The method of claim 1, wherein the barrier/wetting layer has a thickness of between about 5 Angstroms and about 1000 Angstroms.

4. The method of claim 1, wherein the conformal metal layer and the metal layer comprise a metal selected from the group of aluminum, copper, and combinations thereof.

5. The method of claim 4, wherein the conformal metal layer is deposited by chemical vapor deposition and the conducting metal layer is deposited by physical vapor deposition or electroplating.

6. The method of claim 1, wherein the metal layer is deposited at a temperature below about 400° C.

7. The method of claim 1, wherein the steps (a) through (c) are performed sequentially in an integrated processing system.

8. The method of claim 1, wherein the steps (a) through (c) are performed in separate chambers.

9. The method of claim 1, further comprising the step of annealing the metal layer at a temperature of between about 250° C. and about 450° C.

10. The method of claim 1, wherein the barrier layer is deposited using ionized metal plasma physical vapor deposition (IMP-PVD) at a chamber pressure between about 0.5 mTorr and about 100 mTorr.

11. The method of claim 1, wherein the barrier layer is deposited by sputtering a target and providing an electromagnetic field between the target and the substrate.

12. The method of claim 11, wherein the electromagnetic field is provided by applying an RF biased between about 200 W and about 24 kW to a coil.

13. The method of claim 12, wherein the target is sputtered by applying a bias between about 200 W and about 24 kW to the target.

14. The method of claim 13, further comprising applying a bias to the substrate of between about 300 W and 1000 W.

15. A process for filling an aperture at the contact level on a substrate, comprising:

a) forming a thin barrier/wetting layer over the surfaces of an aperture, the barrier/wetting layer comprising a material selected from the group of Ta, $TaN_x$, W, $WN_x$, and combinations thereof;

b) forming a thin conformal CVD metal layer over the barrier/wetting layer; and c) forming a PVD metal layer over the CVD metal layer at a temperature less than about 660° C.

16. The process of claim 15, wherein the barrier/wetting layer has a thickness of less than about 2000 Å.

17. The process of claim 15, wherein the CVD metal layer has a thickness of less than the thickness which would seal the top of the aperture.

18. The process of claim 15, wherein the CVD conformal metal layer comprises a conducting metal material selected from the group of aluminum, copper, and combinations thereof.

19. The process of claim 15, wherein the PVD metal layer comprises a metal selected from a group of aluminum, copper, and combinations thereof.

20. The process of claim 19, wherein the PVD layer is deposited at a temperature less than 400° C.

21. The method of claim 15, wherein the barrier layer is deposited using ionized metal plasma physical vapor deposition (IMP-PVD) at a chamber pressure between about 0.5 mTorr and about 100 mTorr.

22. The method of claim 15, wherein the barrier layer is deposited by sputtering a target and providing an electromagnetic field between the target and the substrate.

23. The method of claim 22, wherein the electromagnetic field is provided by applying an RF biased between about 200 W and about 24 kW to a coil.

24. The method of claim 23, wherein the target is sputtered by applying a bias between about 200 W and about 24 kW to the target.

25. The method of claim 24, further comprising applying a bias to the substrate of between about 0 W and 1000 W.

26. The process of claim 15 wherein the CVD is deposited at a temperature below about 400° C.

27. The process of claim 15 wherein the CVD and PVD layers intermix to form an intermixed metal layer.

28. A method of forming a feature at the contact level on a substrate, comprising:

(a) depositing a barrier/wetting layer over the surfaces of an aperture, the barrier/wetting layer comprising a material selected from the group of Ta, $TaN_x$, W, $WN_x$, and combinations thereof; and (b) depositing a metal layer over the surface of the barrier/wetting layer.

29. The method of claim 28, wherein the metal layer is formed by depositing a conformally metal layer over the surface of the barrier/wetting layer, the conformal metal layer having a thickness of between about 200 Angstroms and about 1 micron, and then depositing a conducting metal layer over the conformal metal layer at a temperature below about 660° C.

30. The method of claim 29, wherein the conformal metal layer is deposited by chemical vapor deposition and the conducting metal layer is deposited by physical vapor deposition or electroplating.

31. The method of claim 29, wherein the conformal metal layer and the conducting metal layer comprise a metal selected from the group of aluminum, copper, and combinations thereof.

32. The method of claim 28, further comprising the step of annealing the metal layer at a temperature of between about 250° C. and about 450° C.

33. The method of claim 28, wherein the barrier layer is deposited using ionized metal plasma physical vapor deposition (IMP-PVD) at a chamber pressure between about 0.5 mTorr and about 100 mTorr.

34. The method of claim 33, wherein the barrier layer is deposited by sputtering a target, wherein sputtering the target comprises applying an RF biased between about 200 W and about 24 kW to a coil, applying a bias between about 200 W and about 24 kW to the target, and applying a bias to the substrate of between about 300 W and 1000 W.

* * * * *